(12) United States Patent
Liu et al.

(10) Patent No.: US 11,610,943 B2
(45) Date of Patent: Mar. 21, 2023

(54) DISPLAY PANEL WITH PIXEL ISLANDS AND MICROLENS LAYER AND MANUFACTURING METHOD THEREOF

(71) Applicant: BOE TECHNOLOGY GROUP CO., LTD., Beijing (CN)

(72) Inventors: Dongni Liu, Beijing (CN); Minghua Xuan, Beijing (CN); Li Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 178 days.

(21) Appl. No.: 16/916,205

(22) Filed: Jun. 30, 2020

(65) Prior Publication Data
US 2021/0057493 A1   Feb. 25, 2021

(30) Foreign Application Priority Data

Aug. 21, 2019 (CN) .......................... 201910774801.6

(51) Int. Cl.
*H01L 27/32* (2006.01)
*H01L 51/52* (2006.01)
*H01L 51/00* (2006.01)

(52) U.S. Cl.
CPC ...... *H01L 27/3211* (2013.01); *H01L 51/5275* (2013.01); *H01L 27/3246* (2013.01); *H01L 51/0011* (2013.01)

(58) Field of Classification Search
CPC ............................................ H01L 27/32–3218
See application file for complete search history.

(56) References Cited

U.S. PATENT DOCUMENTS

| 2014/0353618 | A1* | 12/2014 | Shim | .................... | G02B 5/0263 |
| | | | | | 257/40 |
| 2015/0144918 | A1 | 5/2015 | Cho et al. | | |
| 2017/0357091 | A1* | 12/2017 | Jin | ...................... | H01L 27/3218 |
| 2018/0284465 | A1 | 10/2018 | Kwon et al. | | |

(Continued)

FOREIGN PATENT DOCUMENTS

| CN | 1913648 A | 2/2007 |
| CN | 104934462 A | 9/2015 |

(Continued)

OTHER PUBLICATIONS

First Office Action for CN Patent Application No. 201910774801.6 dated Mar. 26, 2021.

(Continued)

*Primary Examiner* — Suberr L Chi
(74) *Attorney, Agent, or Firm* — Xsensus LLP (57) ABSTRACT

The present application relates to the field of display technology, and in particular, to a display panel, method for manufacturing a display panel and display device. The display panel includes: a base substrate; a pixel layer, provided on the base substrate and comprising a plurality of pixel islands; and a microlens layer, provided on a surface of the pixel layer facing away from the base substrate. Each of pixel islands includes a plurality of sub-pixels that emit light of a same color and are seamlessly coupled to each other, and the light emitted by the plurality of sub-pixels in each of the pixel islands is refracted by the microlens layer to be dispersed to different pixel areas.

20 Claims, 6 Drawing Sheets

(56) References Cited

U.S. PATENT DOCUMENTS

2018/0307044 A1 10/2018 Oh et al.
2021/0134844 A1* 5/2021 Liu .................... H01L 51/5275

FOREIGN PATENT DOCUMENTS

| CN | 106097899 A | 11/2016 |
| CN | 106898629 A | 6/2017 |
| CN | 107561723 A | 1/2018 |

OTHER PUBLICATIONS

Second Office Action for CN Patent Application No. 201910774801.6 dated Sep. 23, 2021.

* cited by examiner

DISPLAY PANEL WITH PIXEL ISLANDS AND MICROLENS LAYER AND MANUFACTURING METHOD THEREOF

CROSS-REFERENCE TO RELATED APPLICATION

This application is based upon, claims the benefit of, and claims priority to Chinese Patent Application No. 201910774801.6, filed on Aug. 21, 2019, the entire contents thereof are incorporated herein by reference.

TECHNICAL FIELD

The present disclosure relates to the field of display technology and, in particular, to a display panel, a method for manufacturing a display panel, and a display device.

BACKGROUND

An organic light emitting display (OLED) is one of the current research hotspots in the field of flat panel displays. Compared with a liquid crystal display (LCD), the OLED has many advantages, such as low energy consumption, low production cost, self-luminescence, wide viewing angle, and fast response speed.

At present, in various display devices, such as those used in mobile phones, personal digital assistants (PDAs), digital cameras, and the like, OLED displays have replaced traditional LCD displays. At the same time, a high PPI (pixels per inch) display is getting more and more attention, which is the future development trend in the display field. However, the layout design of a pixel driving circuit and the manufacturing of a fine metal mask (FMM) are two main factors that limit high PPI OLED displays.

It should be noted that the information disclosed in the above background part is only used to enhance the understanding of the background of the present disclosure and, therefore, may include information that does not constitute the prior art known to those of ordinary skill in the art.

SUMMARY

The present disclosure is to provide a display panel, a method for manufacturing a display panel, and a display device.

An aspect of the present disclosure provides a display panel, including: a base substrate; a pixel layer provided on the base substrate and including a plurality of pixel islands; and a microlens layer provided on a surface of the pixel layer facing away from the base substrate. Each of pixel islands includes a plurality of sub-pixels that emit light of a same color and are seamlessly coupled to each other, and the light emitted by the plurality of sub-pixels in each of the pixel islands is refracted by the microlens layer to be dispersed to different pixel areas.

In some embodiments of the present disclosure, the pixel layer includes a plurality of pixel island groups, and each of the pixel island groups includes a plurality of pixel islands adjacent to each other and emitting light of different colors, and the light of different colors emitted by the sub-pixels of different pixel islands in each of the pixel island groups is refracted by the microlens layer to be converged to a same pixel area.

In some embodiments of the present disclosure, the light of different colors emitted by the sub-pixels of different pixel islands in each of the pixel island groups is refracted by the microlens layer to be superimposed in a direction perpendicular to the pixel area and be converged on the same pixel area.

In some embodiments of the present disclosure, the light of different colors emitted by the sub-pixels of different pixel islands in each of the pixel island groups is refracted by the microlens layer to be converged side by side on the same pixel area.

In some embodiments of the present disclosure, the pixel island group includes a first pixel island, a second pixel island, and a third pixel island that are adjacent to each other and emit light of different colors, and there is a gap between the first pixel island, the second pixel island and the third pixel island.

In some embodiments of the present disclosure, the gap is 3 μm to 30 μm.

In some embodiments of the present disclosure, the first pixel island, the second pixel island and the third pixel island are arranged in two rows, and the first pixel island and the second pixel island are arranged in a same row and are adjacent to each other, and the third pixel island is arranged in another row and is adjacent to the first pixel island and the second pixel island.

In some embodiments of the present disclosure, a shape of the pixel island includes any one of a circle, a triangle, a rhombus, a rectangle, and a regular hexagon.

In some embodiments of the present disclosure, the plurality of pixel island groups are arranged in an array.

In some embodiments of the present disclosure, the sub-pixel is an OLED including a first electrode, a light-emitting layer, and a second electrode, the first electrodes of the plurality of sub-pixels in each of the pixel islands are spaced apart from each other, and the light-emitting layers of the plurality of sub-pixels in each of the pixel islands are of an integrated structure.

In some embodiments of the present disclosure, the microlens layer includes a plurality of microlenses.

In some embodiments of the present disclosure, each of the microlenses is arranged to correspond to one of the sub-pixels.

In some embodiments of the present disclosure, each of the microlenses is arranged to correspond to one of the pixel islands.

Another aspect of the present disclosure provides a method for manufacturing a display panel, including: providing a base substrate; forming a pixel layer on the base substrate by using a mask, wherein the pixel layer includes a plurality of pixel islands, and each of pixel islands includes a plurality of sub-pixels that emit light of a same color and are seamlessly coupled to each other; and forming a microlens layer on a surface of the pixel layer facing away from the base substrate. The plurality of sub-pixels in each of the pixel islands are co-evaporated through a same opening of the mask, and the light emitted by the plurality of sub-pixels in each of the pixel islands is refracted by the microlens layer to be dispersed to different pixel areas.

Yet another aspect of the present disclosure provides a display device including the display panel as described in any one of the above embodiments.

It should be noted that the above general description and the following detailed description are merely exemplary and explanatory and should not be construed as limiting of the present disclosure.

BRIEF DESCRIPTION OF THE DRAWINGS

The drawings herein are incorporated into and constitute a part of the specification, show embodiments consistent with the present disclosure, and are used to explain the principles of the present disclosure together with the specification. Understandably, the drawings in the following description are only some embodiments of the present disclosure. Those of ordinary skill in the art may obtain other drawings based on these drawings without creative effort.

DETAILED DESCRIPTION

Example embodiments will now be described more fully with reference to the drawings. However, the example embodiments may be implemented in various forms and should not be construed as being limited to the examples set forth herein. Rather, these embodiments are provided so that the present disclosure is more comprehensive and complete, and fully conveys the concept of the example embodiments to those skilled in the art. Same reference numerals in the drawings denote same or similar structures, and thus their detailed description will be omitted.

Although in the specification, relative terms such as "on" and "under" are used to describe the relative relationship between one component and another component shown, these terms used in the specification are only for convenience of description, for example, according to example directions shown in the drawings. It can be understood that if a device as shown is turned upside down, then a component described as "on" will become the component as "under." When a structure is "on" another structure, it may mean that the structure is integrally formed on the other structure, or that the structure is disposed "directly" on the other structure, or that the structure is disposed "indirectly" on the other structure through another structure.

In OLED display technology, independent light-emitting sub-pixels (i.e., OLED devices) are generally formed by using the FMM evaporation technology. In such technology, a mask, with openings having shapes that are same to the sub-pixels, is manufactured by using a material with a suitable thermal expansion coefficient and elastic modulus, and the sub-pixels are formed by subjecting luminescent material to heat to be sublimated through the openings of the mask and be evaporated onto pixel areas of a base substrate in high-vacuum environment. However, due to the material and manufacturing process of the mask, the opening of the mask is difficult to be less than 10 um. At present, the FMM vapor deposition technology can support the manufacturing of the display panel with at most 400 PPI.

Figure 1:
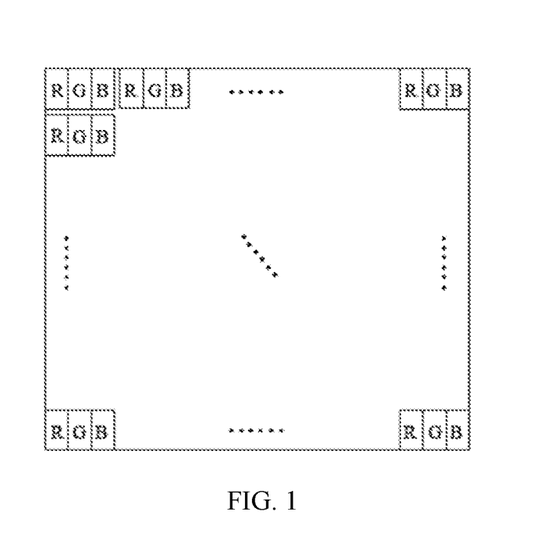
FIG. 1 shows a schematic structural diagram of a conventional pixel design.
Figure 2:
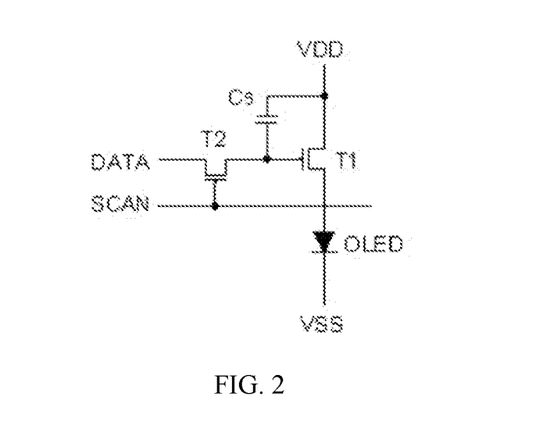
FIG. 2 shows a circuit diagram of a 2T1C circuit.
Figure 3:
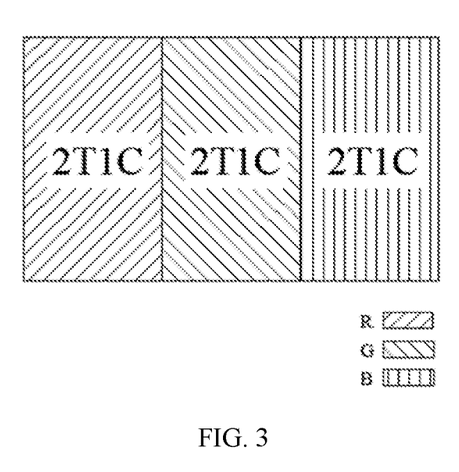
FIG. 3 shows a matching schematic diagram of sub-pixels and 2T1C circuits in a traditional pixel design.

As the PPI increases, a pixel unit (composed of R, G, and B sub-pixels) interval will decrease. In the traditional pixel unit design, the R, G, and B sub-pixels are arranged horizontally and spaced apart from each other, that is, the width of each of the R, G, and B sub-pixels is about ⅓ of the width of the pixel unit (as shown in FIG. 1). By taking a 2T1C circuit (as shown in FIG. 2) as an example, each of the R, G, B sub-pixels corresponds to one 2T1C circuit, as shown in FIG. 3. In considering of the process capability of array machine, the layout design of the pixel driving circuit in the display panel can achieve a maximum of about 1000 PPI. If both the layout design of the pixel driving circuit and the FMM vapor deposition technology are taken into account, in order for the R, G, and B sub-pixels to emit light independently, a maximum 400 PPI can only be achieved, which is poor in resolution. If a manner of white light plus color film is adapted, in such case, the layout design of the pixel driving circuit rather than the FMM vapor deposition technology may be taken into account, and a maximum 1000 PPI can be achieved. However, the transmission rate of the color film is only 20% to 30% and thus, the light transmission rate and the light utilization rate are low.

Figure 4:
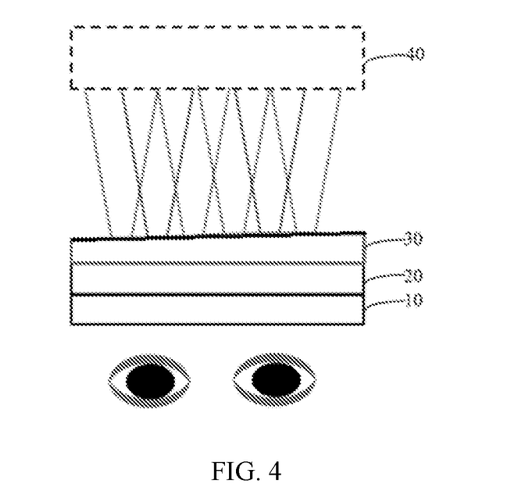
FIG. 4 shows a schematic diagram of a display panel in a used state according to an embodiment of the present disclosure.

In order to solve the above technical problem, embodiments of the present disclosure provide a display panel. The display panel may be, but is not limited to, an OLED display panel, and may also be other display panels applying the following structures. In addition, the display panel may be a transparent display panel, and may be applied to virtual reality (VR) technology. As shown in FIG. 4, when the display panel is applied to a VR device in an embodiment, an image seen by human eyes through the VR device with the display panel is a virtual image.

Specifically, the display panel according to an embodiment may include a base substrate 10, a pixel layer 20, and a microlens layer 30.

Figure 5:
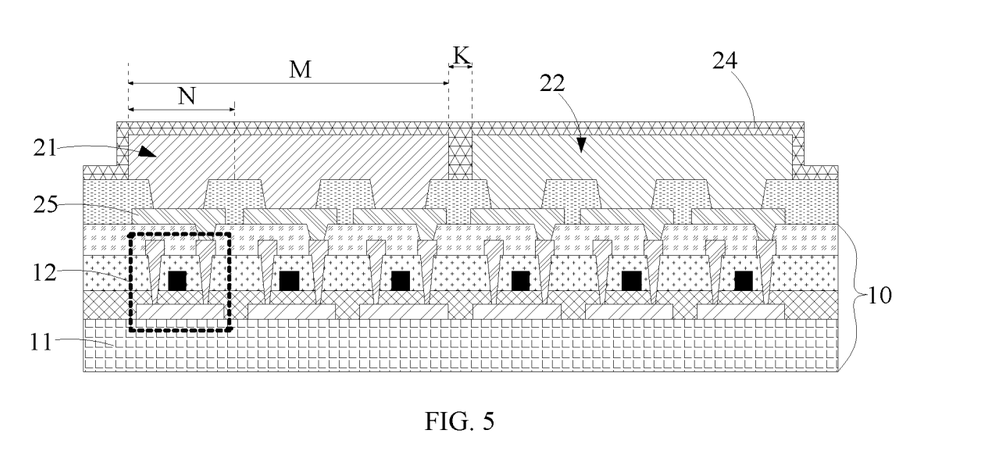
FIG. 5 shows a partial structural diagram of a display panel according to an embodiment of the present disclosure.

As shown in FIG. 5, the base substrate 10 may include a glass substrate 11 and a driving circuit layer formed on the glass substrate 11. The driving circuit layer includes a plurality of thin film transistors 12 and other circuit structures.

The pixel layer 20 is formed on the base substrate 10. The pixel layer 20 may include a pixel island group. In the pixel layer 20, a plurality of the pixel island groups may be arranged in an array. Specifically, the pixel island group may include a plurality of pixel islands. For example, a shape of the pixel island may include, but is not limited to, any one of a circle, a triangle, a rhombus, a rectangle, and a regular hexagon. The pixel island may also be designed into other shapes. Each of the pixel islands is composed of a plurality of sub-pixels, and the respective sub-pixels in each of pixel islands have a same color and are seamlessly coupled to each other.

In an embodiment, the sub-pixel may specifically be an OLED device, that is, the pixel island may be composed of a plurality of OLED devices of the same color. It should be understood that when the sub-pixel is the OLED device, the above description of that the respective sub-pixels in each of pixel islands have the same color and are seamlessly coupled to each other refers to that light-emitting layers of the respective OLED devices in each of the pixel islands have the same color and are seamlessly coupled to each other. As shown in FIG. 5, the OLED device includes not only the light-emitting layer, but also an anode layer 25 and a cathode layer 24.

Each of the OLED devices in the pixel island can emit light independently, that is, each of the OLED devices can be driven to emit light by independently using a driving circuit. For example, each of the OLED devices can be driven by a 2T1C circuit as a simplest OLED driving circuit. The OLED device is a current-driven device. However, a current cannot be stably stored and a voltage can be temporarily stored with a capacitor, therefore a thin film transistor (TFT, for example, TFT 12) is provided to convert the stored voltage into the current. By taking the transistor T1 shown in FIG. 2 as an example, a voltage at a gate of the transistor T1 is converted into a current flowing through the transistor T1. Since the transistor T1 and the OLED device are connected in series, the current flowing through the transistor T1 is a working current of the OLED device. The voltage at the gate of the transistor T1 is a data voltage, which comes from a data line, that is, a line DATA in FIG. 2. There are many rows of signals on the line DATA, and thus a TFT (i.e., a transistor T2 in FIG. 2) is provided to selectively transmit the signal on the line DATA to the gate of the transistor T1. When a signal on the SCAN line is an on signal, the signal on the line DATA is transmitted to the gate of the transistor T1. When the signal on the line SCAN is an off signal, the voltage at the gate of the transistor T1 has nothing to do with the signal on the line DATA, and is held by the capacitor Cs. If the capacitor Cs is not provided, the voltage at the gate of transistor T1 will be drifted easily. Therefore, the OLED device driving circuit includes at least 2T1C to achieve stable display. However, actually, a small-sized screen may adopt 5 to 8 TFTs and 1 to 2 capacitors in order to achieve a high-quality display.

Figure 6:
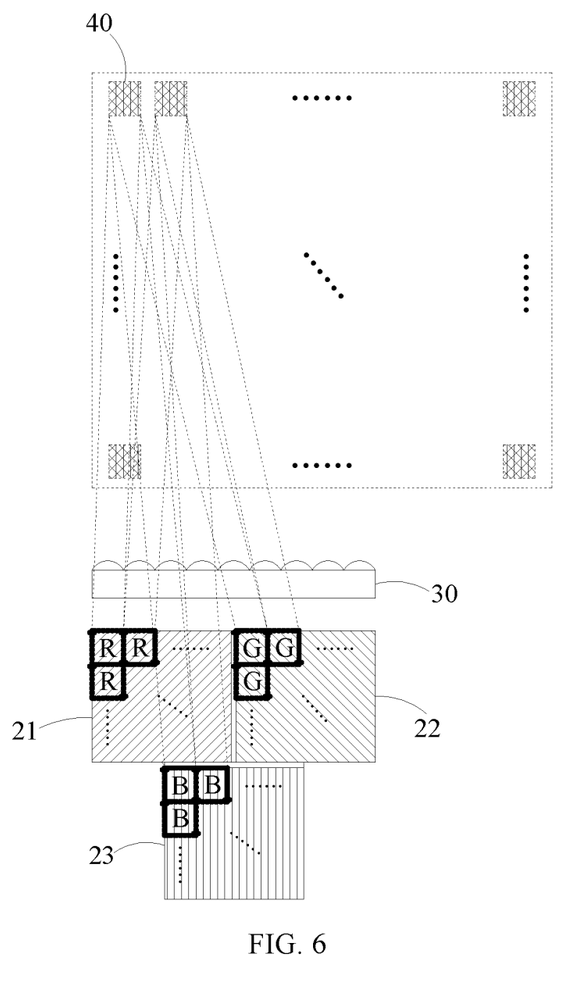
FIG. 6 shows a display principle diagram of a display panel according to an embodiment of the present disclosure.

As shown in FIG. 4, the microlens layer 30 is formed on a surface of the pixel layer 20 facing away from the base substrate 10. The light emitted by the respective sub-pixels in the pixel island is refracted by the microlens layer 30 to be dispersed to different pixel areas 40. As shown in FIG. 6, red light emitted by a plurality of R sub-pixels is refracted by the microlens layer 30 to be dispersed to different pixel areas 40. For example, according to an embodiment, the microlens layer 30 may include a plurality of microlenses arranged in sequence. Each of the microlenses corresponds to one sub-pixel, and the microlens can refract the light emitted by the sub-pixel corresponding thereto to a specified pixel area 40. However, the present disclosure is not limited thereto, and one pixel island may correspond to one microlens, which is dependent on a specific situation.

In view of the above description, a gray-scale display may be achieved by using the microlens layer 30 and the pixel layer 20 in an embodiment of the present disclosure. Since the pixel island is composed of a plurality of sub-pixels which have the same color and seamlessly coupled to each other, when the pixel layer 20 of the display panel is formed by a mask, one pixel island may be formed correspondingly through one opening of the mask, that is, the respective sub-pixels in the pixel island are co-evaporated through the same opening of the mask. That is to say, the light emitting layers of the respective OLED devices in the pixel island can be co-evaporated through the same opening of the mask.

Since the respective sub-pixels in the pixel island are co-evaporated through the same opening of the mask, a display panel with a high PPI display can be manufactured through a mask with a low PPI in an embodiment of the present disclosure. That is, a display panel with a large number of pixels per inch may be manufactured by using a mask with a small number of openings per inch. Specifically, by taking the 2T1C circuit (as shown in FIG. 2) as an example, when the display panel according to the embodiment of the present disclosure is manufactured, the layout design of the pixel driving circuit in the display panel can achieve a maximum of about 1000 PPI, therefore, a 400 PPI mask may be used to achieve a display of 1000 PPI in the embodiment. In view of the above, it can be seen that the embodiment can reduce the difficulty of manufacturing the mask and the difficulty of the evaporation process, and at the same time, can achieve high PPI display. In addition, compared with the solution of white light plus color film, the solution adopted in the embodiment can improve the light transmittance while ensuring high PPI display, thereby improving the light utilization rate and display effect.

It should be understood that in an embodiment, the respective pixel islands may have the same size, and the numbers and sizes of the sub-pixels in respective pixel islands may also be the same. As shown in FIG. 5, a size M of a single pixel island depends on a curvature of a corresponding microlens in the microlens layer 30. The number of sub-pixels that can be arranged in the single pixel island depends on the size M of the pixel island and a size N of the sub-pixel. The number of pixel islands depends on a resolution of the display panel and the number of sub-pixels that can be arranged in the single pixel island.

It should be noted that, in addition to the base substrate 10, the pixel layer 20, and the microlens layer 30, the display panel may include other necessary structures, such as a glass cover or a polarizer. Those skilled in the art can make corresponding designs and supplements according to specific uses of the display panel, which will not be repeated here.

The display panel of the present disclosure will be described in detail below with reference to the drawings.

In an embodiment, the sub-pixels of different pixel islands in the pixel island group have different colors, and the light emitted by the sub-pixels with different colors is refracted by the microlens layer 30 to be converged to the same pixel area 40 to achieve gray-scale display.

It should be understood that in an embodiment, the pixel area 40 refers to an area where a pixel unit is located. The pixel unit is a display unit. The display unit is formed by the light emitted by the sub-pixels with different colors, and the sub-pixels with different colors come from different pixel islands.

Specifically, the light emitted by the sub-pixels with different colors is refracted by the microlens layer 30 to be converged to the same pixel area 40, which may include the following two cases.

In a first case, the light emitted by the sub-pixels with different colors (R, G, and B sub-pixels shown in FIG. 6) is refracted by the microlens layer to vertically superimposed and converged to the same pixel area 40 to achieve gray display. That is, the size of the pixel area 40 is the same as the size of the sub-pixel. Compared with the design of a traditional pixel unit, such design can realize ultra-high PPI display, or can increase the design space for the pixel driving circuit for driving the sub-pixel to emit light.

Specifically, if the size of the sub-pixel is designed to be the same as the size of the sub-pixel in the conventional pixel unit when designing the sub-pixel, since the light emitted by the sub-pixels with different colors is refracted by the microlens layer to be vertically superimposed and converged on the same pixel area 40, the size of the pixel area 40 of the embodiment is greatly reduced compared to the size of the conventional pixel unit, so that a high PPI display can be achieved. If the size of the sub-pixel is designed to be the same as the size of the conventional pixel unit when designing the sub-pixel, the size of the sub-pixel of the embodiment is increased compared to the size of the sub-pixel in the conventional pixel unit, therefore, the design space for the pixel driving circuit for driving the sub-pixel to emit light is increased.

In a second case, the light emitted by the sub-pixels with different colors is refracted by the microlens layer to be horizontally arranged side by side and converged to the same pixel area to achieve gray-scale display. That is, the size of the pixel area is about n (the number of sub-pixels emitting light that is converged into the same pixel area) times the size of the sub-pixel.

Figure 7:
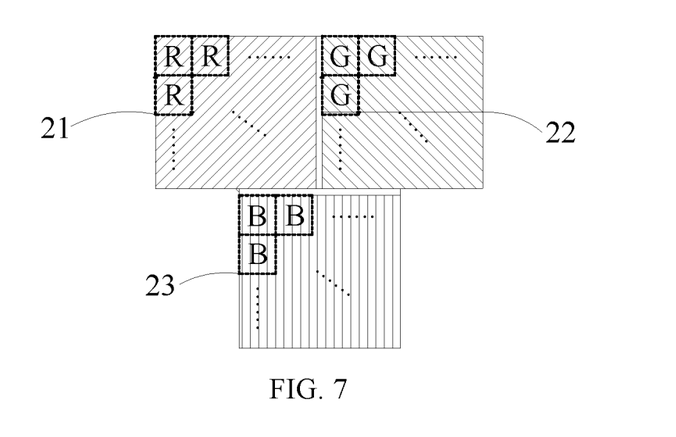
FIG. 7 is a schematic diagram of a pixel island group in a display panel according to an embodiment of the present disclosure.
Figure 8:
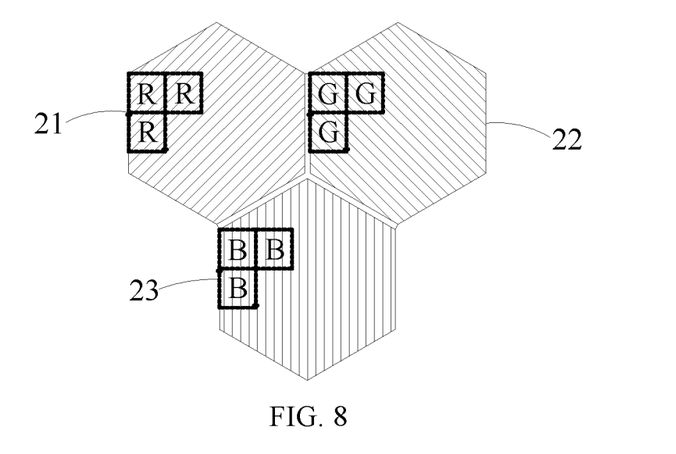
FIG. 8 is a schematic diagram of a pixel island group in a display panel according to another embodiment of the present disclosure.

In an embodiment, as shown in FIGS. 7 and 8, the pixel island group may include a first pixel island 21, a second pixel island 22 and a third pixel island 23. For example, the first pixel island 21 has sub-pixels of red color, the second pixel island 22 has sub-pixels of green color, and the third pixel island 23 has sub-pixels of blue color. That is, the first pixel island 21 may be an R pixel island, the second pixel island 22 may be a G pixel island, and the third pixel island 23 may be a B pixel island. It should be understood that the number of pixel islands in the pixel island group is not limited to three, and may be two or more.

In order to avoid color mixing between the first pixel island 21, the second pixel island 22, and the third pixel island 23, the first pixel island 21, the second pixel island 22 and the third pixel island 23 may be designed to have a gap therebetween, and the gap is about 3 μm to 30 μm.

Specifically, the size of the gap between the first pixel island 21, the second pixel island 22, and the third pixel island 23 is affected by a plurality of influencing factors, as shown in Table 1 below. The plurality of influencing factors may include a total pitch (TP, which is used to measure an accuracy of forming a pattern on a substrate), an anode critical dimension tolerance, a mask pattern position accuracy (Mask PPA), a mask critical dimension tolerance, an alignment accuracy, a shadow effect, a temperature shrink, a design/process margin and the like.

In an embodiment, the gap value may be calculated according to the following formula (1):

$$K=2\times[(\sqrt{A^2+B^2+C^2+D^2+E^2})+F+G+H] \quad (1)$$

It should be noted that, in order to facilitate the writing of formula (1), each serial number in Table 1 is used to represent each item (i.e., each influencing factor). According to Table 1, a minimum value of the gap K between the first pixel island 21, the second pixel island 22, and the third pixel island 23 (as shown in FIG. 7) is about 3.27 um, and a standard value is about 20.5 um.

TABLE 1

| Number | Item | Min value (um) | standard value (um) |
| --- | --- | --- | --- |
| A | TP | 0.055 | ±1.0 |
| B | Anode CD Tolerance | 0.05 | 1.0 |
| C | Mask PPA | 0.05 | ±3.0 |
| D | Mask CD Tolerance | 0.05 | ±2.5 |
| E | Alignment Accuracy | 0.5 | ±3 |
| F | Shadow effect | 0.5 | 3 |
| G | Temp Shrinkage | 0.624 | 2 |
| H | Design/Process margin | 0 | 0 |
| K | Gap | 3.27 | 20.5 |

However, it should be understood that the plurality of influencing factors are not limited to the items mentioned in Table 1, and may include other items. Therefore, the calculation formula of the gap K between the first pixel island 21, the second pixel island 22, and the third pixel island 23 is not limited to the above formula (1), and the value of the gap K is also not limited to the above Table 1, which is depended on a specific situation.

For example, the aforementioned first pixel island 21, second pixel island 22, and third pixel island 23 may be arranged in two rows. The first pixel island 21, the second pixel island 22 are arranged in the same row and are adjacent to each other, and the third pixel island 23 is arranged in another row and is adjacent to the first pixel island 21 and the second pixel island 22 to reduce the design difficulty of the display panel. By taking that the pixel island is of rectangle and regular hexagon as an example, as shown in FIG. 7, when the pixel island is of the rectangular, the connection line of the centers of the first pixel island 21, the second pixel island 22, and the third pixel island 23 may form a isosceles triangle; as shown in FIG. 8, when the pixel island is of the regular hexagon, the connection line of the centers of the first pixel island 21, the second pixel island 22 and the third pixel island 23 may form an equilateral triangle.

Figure 9:
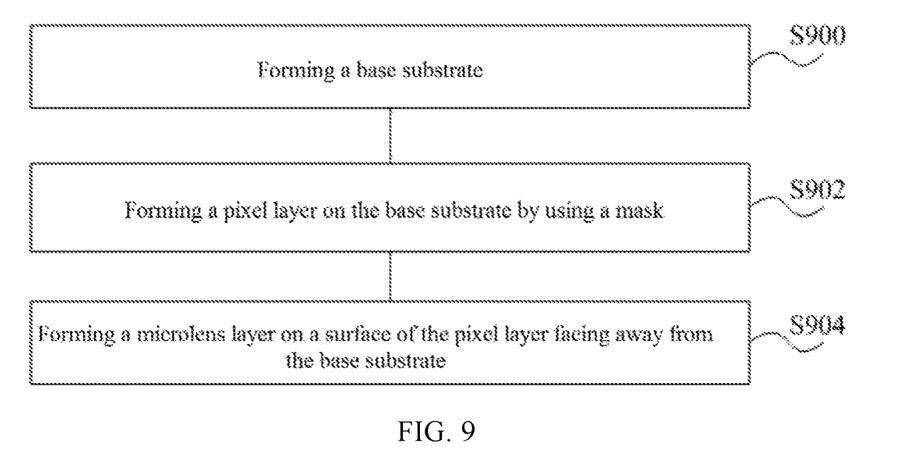
FIG. 9 shows a flowchart of a method for manufacturing a display panel according to an embodiment of the present disclosure.

An embodiment of the present disclosure further provides a method for manufacturing the display panel according to any one of the foregoing embodiments. As shown in FIG. 9, the method for manufacturing the display panel may include:

step S900, forming a base substrate;

step S902, forming a pixel layer on the base substrate, wherein the pixel layer includes a pixel island group, the pixel island includes a plurality of pixel islands, and the pixel island includes a plurality of sub-pixels that are of a same color and are seamlessly coupled to each other; and step S904, forming a microlens layer on a surface of the pixel layer facing away from the base substrate.

The respective sub-pixels in the pixel island are co-evaporated through a same opening of a mask, and light emitted by the respective sub-pixels in the pixel island is refracted by the microlens layer to be dispersed to different pixel areas.

Since the respective sub-pixels in the pixel island are co-evaporated through the same opening of the mask, a display panel with a high PPI display can be manufactured through a mask with a low PPI in an embodiment. That is, the embodiment can reduce the difficulty of manufacturing the mask and the difficulty of the evaporation process, and at the same time, can achieve high PPI display. In addition, compared with the solution of white light plus color film, the solution adopted in the embodiment can improve the light transmittance while ensuring high PPI display, thereby improving the light utilization rate and display effect.

It should be noted that before step S904 is performed, a packaging process may be performed on the respective sub-pixels in the pixel layer to ensure the sealing of the sub-pixels.

An embodiment of the present disclosure further provides a display device including the aforementioned display panel. According to an embodiment of the present disclosure, the specific type of the display device is not particularly limited, and the types of display devices commonly used in the art may be used. Specifically, the display device may be displays, mobile devices, wearable devices, VR devices and the like, for example. Those skilled in the art may make a corresponding selection according to a specific use of the display device, which will not be described in detail here.

It should be noted that the display device includes other necessary components in addition to the display panel. By taking that the display device is a display as an example, the display device may further include a case, a circuit board, a power line and the like. Those skilled in the art may make corresponding supplementations according to the specific use of the display device, which will not be described in detail here.

The terms "a", "an", "the", and "said" are used to indicate the presence of one or more elements, components, etc. The terms "include" and "have" are used to indicate an open-ended inclusion and that there may be additional elements/component/etc. in addition to the listed elements, components, etc. The terms "first", "second", etc. are only used for marking, are not to limit the number of objects.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common knowledge or conventional technical means in the art that are not disclosed in the present disclosure. The specification and embodiments are illustrative, and the real scope and spirit of the present disclosure is defined by the appended claims.

What is claimed is:

1. A display panel, comprising:
   a base substrate;
   a pixel layer provided on the base substrate and comprising a plurality of pixel islands; and
   a microlens layer provided on a surface of the pixel layer facing away from the base substrate,
   wherein each of the plurality of pixel islands comprises a plurality of sub-pixels that emit light of a same color and are seamlessly coupled to each other, and
   wherein the display panel is configured to refract, by the microlens layer, the light emitted by the plurality of sub-pixels in each of the plurality of pixel islands to be dispersed to different pixel units.

2. The display panel according to claim 1, wherein:
   the plurality of pixel islands are divided into a plurality of pixel island groups, and each of the plurality of pixel island groups comprises a plurality of pixel islands adjacent to each other and emitting light of different colors; and
   light of different colors emitted by sub-pixels of the plurality of pixel islands in each of the plurality of pixel island groups is refracted by the microlens layer to be converged to a same pixel unit.

3. The display panel according to claim 2, wherein the light of different colors emitted by the sub-pixels of the plurality of pixel islands in each of the plurality of pixel island groups is refracted by the microlens layer to be superimposed in a direction perpendicular to the pixel unit and be converged on the same pixel unit.

4. The display panel according to claim 2, wherein the light of different colors emitted by the sub-pixels of the plurality of pixel islands in each of the plurality of pixel island groups is refracted by the microlens layer to be converged side by side on the same pixel unit.

5. The display panel according to claim 2, wherein each of the plurality of pixel island groups comprises a first pixel island, a second pixel island, and a third pixel island that are adjacent to each other and emit light of different colors, and there is a gap between the first pixel island, the second pixel island and the third pixel island.

6. The display panel according to claim 5, wherein the gap is 3 μm to 30 μm.

7. The display panel according to claim 5, wherein:
   the first pixel island, the second pixel island, and the third pixel island are arranged in two rows; and
   the first pixel island and the second pixel island are arranged in a same row and are adjacent to each other, and the third pixel island is arranged in another row and is adjacent to the first pixel island and the second pixel island.

8. The display panel according to claim 1, wherein a shape of each of the plurality of pixel islands comprises any one of a circle, a triangle, a rhombus, a rectangle, and a regular hexagon.

9. The display panel according to claim 2, wherein the plurality of pixel island groups are arranged in an array.

10. The display panel according to claim 1, wherein:
    each of the plurality of sub-pixels is an OLED comprising a first electrode, a light-emitting layer, and a second electrode;
    the first electrodes of the plurality of sub-pixels in each of the plurality of pixel islands are spaced apart from each other; and
    the light-emitting layers of the plurality of sub-pixels in each of the plurality of pixel islands are of an integrated structure.

11. The display panel according to claim 1, wherein the microlens layer comprises a plurality of microlenses.

12. The display panel according to claim 11, wherein each of the plurality of microlenses is arranged to correspond to one of the plurality of sub-pixels.

13. The display panel according to claim 11, wherein each of the plurality of microlenses is arranged to correspond to one of the plurality of pixel islands.

14. A method for manufacturing the display panel according to claim 1, comprising:
    providing a base substrate;
    forming a pixel layer on the base substrate by using a mask, wherein the pixel layer comprises a plurality of pixel islands, and each of the plurality of pixel islands comprises a plurality of sub-pixels that emit light of a same color and are seamlessly coupled to each other; and
    forming a microlens layer on a surface of the pixel layer facing away from the base substrate,
    wherein the plurality of sub-pixels in each of the plurality of pixel islands are co-evaporated through a same opening of the mask, and
    wherein the display panel is configured to refract, by the microlens layer, the light emitted by the plurality of sub-pixels in each of the plurality of pixel islands to be dispersed to different pixel units.

15. A display device, comprising a display panel, wherein the display panel comprises:
    a base substrate;
    a pixel layer, provided on the base substrate and comprising a plurality of pixel islands; and
    a microlens layer, provided on a surface of the pixel layer facing away from the base substrate,
    wherein each of the plurality of pixel islands comprises a plurality of sub-pixels that emit light of a same color and are seamlessly coupled to each other, and
    wherein the display panel is configured to refract, by the microlens layer, the light emitted by the plurality of sub-pixels in each of the plurality of pixel islands to be dispersed to different pixel units.

16. The display device according to claim 15, wherein the plurality of pixel islands are divided into a plurality of pixel island groups, and each of the plurality of pixel island groups comprises a plurality of pixel islands adjacent to each other and emitting light of different colors, and wherein light of different colors emitted by sub-pixels of the plurality of pixel islands in each of the plurality of pixel island groups is refracted by the microlens layer to be converged to a same pixel unit.

17. The display device according to claim 16, wherein the light of different colors emitted by the sub-pixels of the plurality of pixel islands in each of the plurality of pixel island groups is refracted by the microlens layer to be superimposed in a direction perpendicular to the pixel unit and be converged on the same pixel unit.

18. The display device according to claim 16, wherein the light of different colors emitted by the sub-pixels of the plurality of pixel islands in each of the plurality of pixel island groups is refracted by the microlens layer to be converged side by side on the same pixel unit.

19. The display device according to claim 16, wherein each of the plurality of pixel island groups comprises a first pixel island, a second pixel island, and a third pixel island that are adjacent to each other and emit light of different colors, and there is a gap between the first pixel island, the second pixel island and the third pixel island.

20. The display device according to claim 19, wherein the gap is 3 μm to 30 μm.

* * * * *